United States Patent
Wei et al.

(10) Patent No.: US 9,923,567 B2
(45) Date of Patent: Mar. 20, 2018

(54) ANALOG-TO-DIGITAL CONVERTER PROTECTION CIRCUIT, METHOD FOR CONTROLLING ANALOG-TO-DIGITAL CONVERTER PROTECTION CIRCUIT, AND CONTROLLER

(71) Applicant: Huawei Technologies Co., Ltd., Shenzhen (CN)

(72) Inventors: Qiwen Wei, Wuhan (CN); Qi Cheng, Wuhan (CN); Weiguo Li, Wuhan (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 15/540,864

(22) PCT Filed: Dec. 30, 2014

(86) PCT No.: PCT/CN2014/095500
§ 371 (c)(1),
(2) Date: Jun. 29, 2017

(87) PCT Pub. No.: WO2016/106544
PCT Pub. Date: Jul. 7, 2016

(65) Prior Publication Data
US 2017/0373699 A1 Dec. 28, 2017

(51) Int. Cl.
*H03M 1/06* (2006.01)
*H02H 7/20* (2006.01)
*G02B 6/42* (2006.01)

(52) U.S. Cl.
CPC ............... *H03M 1/06* (2013.01); *H02H 7/20* (2013.01); *G02B 6/4246* (2013.01); *G02B 6/4274* (2013.01)

(58) Field of Classification Search
CPC .......... H03M 1/124; H03M 1/06; H02H 3/38; H02H 7/20; H04J 14/0221; H04B 10/60; G02B 6/4274; G02B 6/4246
(Continued)

(56) References Cited

U.S. PATENT DOCUMENTS 8,446,305 B1   5/2013   Zanoni et al.
9,013,340 B1   4/2015   Hou et al.
(Continued)

FOREIGN PATENT DOCUMENTS

CN   102255275 A   11/2011
CN   102394694 A    3/2012
(Continued)

*Primary Examiner* — Khai M Nguyen
(74) *Attorney, Agent, or Firm* — Slater Matsil, LLP

(57) ABSTRACT

An analog-to-digital converter protection circuit, a method for controlling an analog-to-digital converter protection circuit, and a controller are disclosed. The analog-to-digital converter protection circuit includes: an analog switch, an analog-to-digital converter, a controller, and a series circuit including at least two resistors connected in series. The controller is configured to: when the digital voltage is greater than or equal to a preset voltage threshold, output a control signal to the analog switch, to trigger the analog switch to control to a second sampling end from a first sampling end to serve as the conduction sampling end to conduct to the output end of the analog switch, where an analog voltage sampled by the second sampling end is less than an analog voltage sampled by the first sampling end; and when the digital voltage is less than the preset voltage threshold, output the digital voltage.

20 Claims, 3 Drawing Sheets

(58) Field of Classification Search
USPC .......................................... 341/118, 137, 155
See application file for complete search history.

(56) References Cited

U.S. PATENT DOCUMENTS

2008/0129369 A1* 6/2008 Ivancevic ............ H03K 17/005
327/410
2010/0269883 A1 10/2010 Sarhan

FOREIGN PATENT DOCUMENTS

| CN | 202168086 U | 3/2012 |
| CN | 102460878 A | 5/2012 |
| CN | 102752046 A | 10/2012 |
| CN | 103067077 A | 4/2013 |
| CN | 203104449 U | 7/2013 |
| CN | 103297121 A | 9/2013 |
| CN | 103475406 A | 12/2013 |
| CN | 103684458 A | 3/2014 |
| CN | 203774770 U | 8/2014 |
| EP | 1041750 A2 | 10/2000 |

* cited by examiner

ANALOG-TO-DIGITAL CONVERTER PROTECTION CIRCUIT, METHOD FOR CONTROLLING ANALOG-TO-DIGITAL CONVERTER PROTECTION CIRCUIT, AND CONTROLLER

CROSS-REFERENCE TO RELATED APPLICATIONS

This application is a National Stage of International Application No. PCT/CN2014/095500, filed on Dec. 30, 2014, which is hereby incorporated by reference in its entirety.

TECHNICAL FIELD

The present invention relates to the field of electronic technologies, and specifically, to an analog-to-digital converter protection circuit, a method for controlling an analog-to-digital converter protection circuit, and a controller.

BACKGROUND

In an FITH (Fiber To The Home) system, quality of an access fiber link is very important to user experience. A user usually obtains a magnitude of a receive optical power of an ONU by using an RSSI (Received Signal Strength Indication) of the ONU, and further determines quality of an access fiber link.

At present, a circuit for detecting a magnitude of a receive optical power in an ONU, as shown in FIG. 1, includes an analog-to-digital converter and a sampling circuit. The sampling circuit includes a filter capacitor C and a sampling resistor R that are connected in parallel. One end of the sampling resistor R is connected to an input end of the analog-to-digital converter and is configured to be connected to an output end of a BOSA (Bi-Directional Optical Sub-Assembly), and the other end of the sampling resistor R is connected to a grounding end of the analog-to-digital converter and is configured to be grounded. One end of the filter capacitor C is configured to be connected to the output end of BOSA, and the other end of the filter capacitor C is configured to be grounded. A principle of the circuit shown in FIG. 1 is as follows: The BOSA converts a received optical signal into a photocurrent and inputs the photocurrent to the sampling circuit to form an analog voltage. The analog-to-digital converter performs analog-to-digital conversion on the analog voltage and outputs a digital voltage. In an actual application, the ONU performs sampling on five optical signals with different optical powers by using the circuit shown in FIG. 1, to obtain five different digital voltages. Then, the ONU performs curve fitting on the optical powers and the digital voltages corresponding to the optical powers, to obtain a correspondence curve between the digital voltages and the optical powers. In this way, the ONU can calculate a magnitude of an optical power of a received optical signal according to a digital voltage outputted by the analog-to-digital converter and the correspondence curve.

However, when an optical power of an optical signal received by the BOSA is excessively large, a photocurrent inputted to the sampling circuit is also excessively large. Consequently, an analog voltage across the two ends of the sampling resistor exceeds a sampling voltage range of the analog-to-digital converter, causing damage to the analog-to-digital converter.

SUMMARY

Embodiments of the present invention disclose an analog-to-digital converter protection circuit, a method for controlling an analog-to-digital converter protection circuit, and a controller, so that an analog-to-digital converter can sample an analog voltage within a sampling voltage range of the analog-to-digital converter.

A first aspect of the embodiments of the present invention discloses an analog-to-digital converter protection circuit, including an analog switch, an analog-to-digital converter, a controller, and a series circuit. The series circuit includes at least two resistors connected in series. A head end of the series circuit is configured to be connected to an output end of a bi-directional optical sub-assembly BOSA. A tail end of the series circuit is configured to be grounded. A ground-distant end of each resistor in the series circuit is connected to a different sampling end of the analog switch. An output end of the analog switch is connected to an input end of the analog-to-digital converter. An output end of the analog-to-digital converter is connected to an input end of the controller. A first output end of the controller is connected to a control end of the analog switch. The series circuit is configured to convert a photocurrent outputted by the BOSA into an analog voltage. The different sampling end is configured to sample the analog voltage outputted by the series circuit. The analog switch is configured to output, to the analog-to-digital converter. An analog voltage sampled by a conduction sampling end of the analog switch. A first sampling end serves as the conduction sampling end to conduct to the output end of the analog switch. The analog-to-digital converter is configured to: perform analog-to-digital conversion on the analog voltage sampled by the conduction sampling end to generate a digital voltage, and output the digital voltage to the controller. The controller is configured to: when the digital voltage is greater than or equal to a first preset voltage threshold, output a first control signal to the analog switch, where the first control signal is used to trigger the analog switch to control a second sampling end to serve as the conduction sampling end to conduct to the output end of the analog switch, and an analog voltage sampled by the second sampling end is less than an analog voltage sampled by the first sampling end. When the digital voltage is less than the first preset voltage threshold, control a second output end of the controller to output the digital voltage, where the first preset voltage threshold falls within a sampling voltage range of the analog-to-digital converter.

In a first possible implementation manner of the first aspect of the embodiments of the present invention, that when the digital voltage is less than the first preset voltage threshold, the controller controls a second output end of the controller to output the digital voltage is specifically: when the digital voltage is less than the first preset voltage threshold and the digital voltage is greater than a second preset voltage threshold, controlling the second output end of the controller to output the digital voltage, where the second preset voltage threshold falls within the sampling voltage range; and the controller is further configured to: when the digital voltage is less than or equal to the second preset voltage threshold, output a second control signal to the analog switch, where the second control signal is used to trigger the analog switch to control a third sampling end to serve as the conduction sampling end to conduct to the output end of the analog switch, and an analog voltage sampled by the third sampling end is greater than the analog voltage sampled by the first sampling end.

With reference to the first aspect of the embodiments of the present invention or the first possible implementation manner of the first aspect of the embodiments of the present invention, in a second possible implementation manner of the first aspect of the embodiments of the present invention, when the analog switch controls and changes the conduction sampling end conducted to the output end of the analog switch, a resistor quantity change between the conduction sampling end conducted to the output end of the analog switch and the tail end of the series circuit is at least 1.

With reference to any one of the first aspect of the embodiments of the present invention or the foregoing possible implementation manners of the first aspect of the embodiments of the present invention, in a third possible implementation manner of the first aspect of the embodiments of the present invention, an initial conduction sampling end conducted to the output end of the analog switch is a sampling end connected to a ground-distant end of a tail resistor of the series circuit; and a product of a resistance value of the tail resistor of the series circuit and a preset photocurrent threshold falls within the sampling voltage range.

With reference to any one of the first aspect of the embodiments of the present invention or the foregoing possible implementation manners of the first aspect of the embodiments of the present invention, in a fourth possible implementation manner of the first aspect of the embodiments of the present invention, a product of a total resistance value of all resistors in the series circuit and the preset photocurrent threshold is greater than or equal to sampling precision of the analog-to-digital converter.

With reference to any one of the first aspect of the embodiments of the present invention or the foregoing possible implementation manners of the first aspect of the embodiments of the present invention, in a fifth possible implementation manner of the first aspect of the embodiments of the present invention, the controller is a bi-directional optical sub-assembly drive chip.

With reference to any one of the first aspect of the embodiments of the present invention or the foregoing possible implementation manners of the first aspect of the embodiments of the present invention, in a sixth possible implementation manner of the first aspect of the embodiments of the present invention, the analog switch includes any one of an integrated analog switch component, a discrete component, or a relay.

A second aspect of the embodiments of the present invention discloses a method for controlling an analog-to-digital converter protection circuit. The analog-to-digital converter protection circuit includes an analog switch, an analog-to-digital converter, a controller, and a series circuit. The series circuit includes at least two resistors connected in series. A head end of the series circuit is configured to be connected to an output end of a BOSA. A tail end of the series circuit is configured to be grounded, a ground-distant end of each resistor in the series circuit is connected to a different sampling end of the analog switch. An output end of the analog switch is connected to an input end of the analog-to-digital converter. An output end of the analog-to-digital converter is connected to an input end of the controller. A first output end of the controller is connected to a control end of the analog switch. The method includes: receiving, by the controller, a digital voltage outputted by the analog-to-digital converter, where the digital voltage is a digital voltage obtained by the analog-to-digital converter by performing analog-to-digital conversion on an analog voltage sampled by a conduction sampling end of the analog switch, and a first sampling end serves as the conduction sampling end to conduct to the output end of the analog switch. The method also includes, when the digital voltage is greater than or equal to a first preset voltage threshold, outputting, by the controller, a first control signal to the analog switch, where the first control signal is used to trigger the analog switch to control a second sampling end to serve as the conduction sampling end to conduct to the output end of the analog switch, an analog voltage sampled by the second sampling end is less than an analog voltage sampled by the first sampling end, and the first preset voltage threshold falls within a sampling voltage range of the analog-to-digital converter. The method also includes, when the digital voltage is less than the first preset voltage threshold, controlling, by the controller, a second output end of the controller to output the digital voltage.

In a first possible implementation manner of the second aspect of the embodiments of the present invention, the when the digital voltage is less than the first preset voltage threshold, controlling, by the controller, a second output end of the controller to output the digital voltage includes: when the digital voltage is less than the first preset voltage threshold and the digital voltage is greater than a second preset voltage threshold, controlling, by the controller, the second output end of the controller to output the digital voltage, where the second preset voltage threshold falls within the sampling voltage range; and when the digital voltage is less than or equal to the second preset voltage threshold, outputting, by the controller, a second control signal to the analog switch, where the second control signal is used to trigger the analog switch to control a third sampling end to serve as the conduction sampling end to conduct to the output end of the analog switch, and an analog voltage sampled by the third sampling end is greater than the analog voltage sampled by the first sampling end.

With reference to the second aspect of the embodiments of the present invention or the first possible implementation manner of the second aspect of the embodiments of the present invention, in a second possible implementation manner of the second aspect of the embodiments of the present invention, when the analog switch controls and changes the conduction sampling end conducted to the output end of the analog switch, a resistor quantity change between the conduction sampling end conducted to the output end of the analog switch and the tail end of the series circuit is at least 1.

With reference to any one of the second aspect of the embodiments of the present invention or the foregoing possible implementation manners of the second aspect of the embodiments of the present invention, in a third possible implementation manner of the second aspect of the embodiments of the present invention, an initial conduction sampling end conducted to the output end of the analog switch is a sampling end connected to a ground-distant end of a tail resistor of the series circuit; and a product of a resistance value of the tail resistor of the series circuit and a preset photocurrent threshold falls within the sampling voltage range.

With reference to any one of the second aspect of the embodiments of the present invention or the foregoing possible implementation manners of the second aspect of the embodiments of the present invention, in a fourth possible implementation manner of the second aspect of the embodiments of the present invention, a product of a total resistance value of all resistors in the series circuit and the preset photocurrent threshold is greater than or equal to sampling precision of the analog-to-digital converter.

With reference to any one of the second aspect of the embodiments of the present invention or the foregoing possible implementation manners of the second aspect of the embodiments of the present invention, in a fifth possible implementation manner of the second aspect of the embodiments of the present invention, the controller is a bi-directional optical sub-assembly drive chip.

With reference to any one of the second aspect of the embodiments of the present invention or the foregoing possible implementation manners of the second aspect of the embodiments of the present invention, in a sixth possible implementation manner of the second aspect of the embodiments of the present invention, the analog switch includes any one of an integrated analog switch component, a discrete component, or a relay.

A third aspect of the embodiments of the present invention discloses a controller in an analog-to-digital converter protection circuit, including: a processor, a memory, an input port, a first output port, and a second output port. The analog-to-digital converter protection circuit includes an analog switch, an analog-to-digital converter, the controller, and a series circuit. The series circuit includes at least two resistors connected in series. A head end of the series circuit is configured to be connected to an output end of a BOSA. A tail end of the series circuit is configured to be grounded. A ground-distant end of each resistor in the series circuit is connected to a different sampling end of the analog switch. An output end of the analog switch is connected to an input end of the analog-to-digital converter. An output end of the analog-to-digital converter is connected to the input port, and the first output port is connected to a control end of the analog switch. The input port is configured to receive a digital voltage outputted by the analog-to-digital converter, where the digital voltage is a digital voltage obtained by the analog-to-digital converter by performing analog-to-digital conversion on an analog voltage sampled by a conduction sampling end of the analog switch, and a first sampling end serves as the conduction sampling end to conduct to the output end of the analog switch. The memory stores a set of program code, and the processor is configured to invoke the program code stored in the memory to perform the following operation: determining whether the digital voltage is greater than or equal to a first preset voltage threshold, where the first preset voltage threshold falls within a sampling voltage range of the analog-to-digital converter. The first output port is configured to: when the digital voltage is greater than or equal to the first preset voltage threshold, output a first control signal to the analog switch, where the first control signal is used to trigger the analog switch to control a second sampling end to serve as the conduction sampling end to conduct to the output end of the analog switch, and an analog voltage sampled by the second sampling end is less than an analog voltage sampled by the first sampling end. The second output port is configured to: when the digital voltage is less than the first preset voltage threshold, output the digital voltage.

In a first possible implementation manner of the third aspect of the embodiments of the present invention, the processor is configured to invoke the program code stored in the memory to further perform the following operation: determining whether the digital voltage is greater than a second preset voltage threshold, where the second preset voltage threshold falls within the sampling voltage range; the second output port is specifically configured to: when the digital voltage is less than the first preset voltage threshold and the digital voltage is greater than the second preset voltage threshold, output the digital voltage; and the first output port is further configured to: when the digital voltage is less than or equal to the second preset voltage threshold, output a second control signal to the analog switch, where the second control signal is used to trigger the analog switch to control a third sampling end to serve as the conduction sampling end to conduct to the output end of the analog switch, and an analog voltage sampled by the third sampling end is greater than the analog voltage sampled by the first sampling end.

With reference to the third aspect of the embodiments of the present invention or the first possible implementation manner of the third aspect of the embodiments of the present invention, in a second possible implementation manner of the third aspect of the embodiments of the present invention, when the analog switch controls and changes the conduction sampling end conducted to the output end of the analog switch, a resistor quantity change between the conduction sampling end conducted to the output end of the analog switch and the tail end of the series circuit is at least 1.

With reference to any one of the third aspect of the embodiments of the present invention or the foregoing possible implementation manners of the third aspect of the embodiments of the present invention, in a third possible implementation manner of the third aspect of the embodiments of the present invention, an initial conduction sampling end conducted to the output end of the analog switch is a sampling end connected to a ground-distant end of a tail resistor of the series circuit; and a product of a resistance value of the tail resistor of the series circuit and a preset photocurrent threshold falls within the sampling voltage range.

With reference to any one of the third aspect of the embodiments of the present invention or the foregoing possible implementation manners of the third aspect of the embodiments of the present invention, in a fourth possible implementation manner of the third aspect of the embodiments of the present invention, a product of a total resistance value of all resistors in the series circuit and the preset photocurrent threshold is greater than or equal to sampling precision of the analog-to-digital converter.

With reference to any one of the third aspect of the embodiments of the present invention or the foregoing possible implementation manners of the third aspect of the embodiments of the present invention, in a fifth possible implementation manner of the third aspect of the embodiments of the present invention, the controller is a bi-directional optical sub-assembly drive chip.

With reference to any one of the third aspect of the embodiments of the present invention or the foregoing possible implementation manners of the third aspect of the embodiments of the present invention, in a sixth possible implementation manner of the third aspect of the embodiments of the present invention, the analog switch includes any one of an integrated analog switch component, a discrete component, or a relay.

In the embodiments of the present invention, an analog-to-digital converter protection circuit includes an analog switch, an analog-to-digital converter, a controller, and a series circuit including at least two resistors connected in series. The series circuit is configured to convert a photocurrent into an analog voltage. The analog switch is configured to output, to the analog-to-digital converter, an analog voltage sampled by a conduction sampling end of the analog switch. The first sampling end serves as the conduction sampling end to conduct to an output end of the analog switch. The analog-to-digital converter is configured to: perform analog-to-digital conversion on the analog voltage sampled by the conduction sampling end to generate a digital voltage, and output the digital voltage to the controller. The controller is configured to: when the digital voltage is greater than or equal to a preset voltage threshold, output a control signal to the analog switch, where the control signal is used to trigger the analog switch to control a second sampling end to serve as the conduction sampling end to conduct to the output end of the analog switch, and an analog voltage sampled by the second sampling end is less than an analog voltage sampled by the first sampling end; and when the digital voltage is less than the preset voltage threshold, output the digital voltage. As can be seen, in the embodiments of the present invention, when the digital voltage outputted by the analog-to-digital converter is greater than or equal to the preset voltage threshold, the controller controls the second sampling end of the analog switch to serve as the conduction sampling end to conduct to the output end of the analog switch, so as to decrease the analog voltage outputted by the analog switch, so that the analog-to-digital converter can sample an analog voltage within a sampling voltage range of the analog-to-digital converter. Therefore, a problem of damage to the analog-to-digital converter due to that the analog voltage exceeds the sampling voltage range of the analog-to-digital converter is avoided.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Embodiments of the present invention disclose an analog-to-digital converter protection circuit, a method for controlling an analog-to-digital converter protection circuit, and a controller, so that an analog-to-digital converter can sample an analog voltage within a sampling voltage range of the analog-to-digital converter. Therefore, a problem of damage to the analog-to-digital converter due to that the analog voltage exceeds the sampling voltage range of the analog-to-digital converter is avoided.

Figure 1:
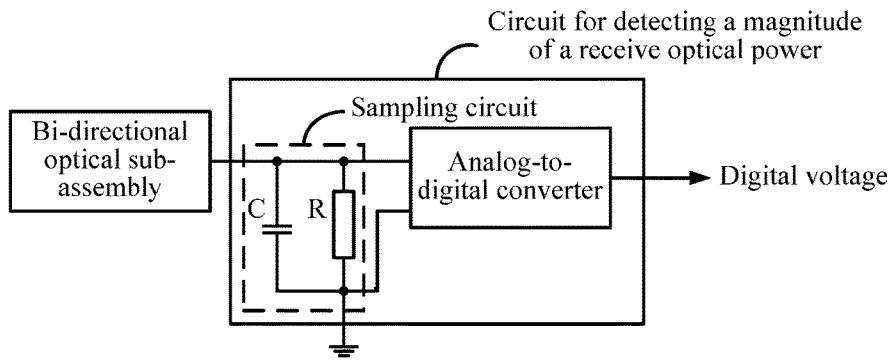
FIG. 1 is a schematic structural diagram of a circuit for detecting a magnitude of a receive optical power according to an embodiment of the present invention.
Figure 2:
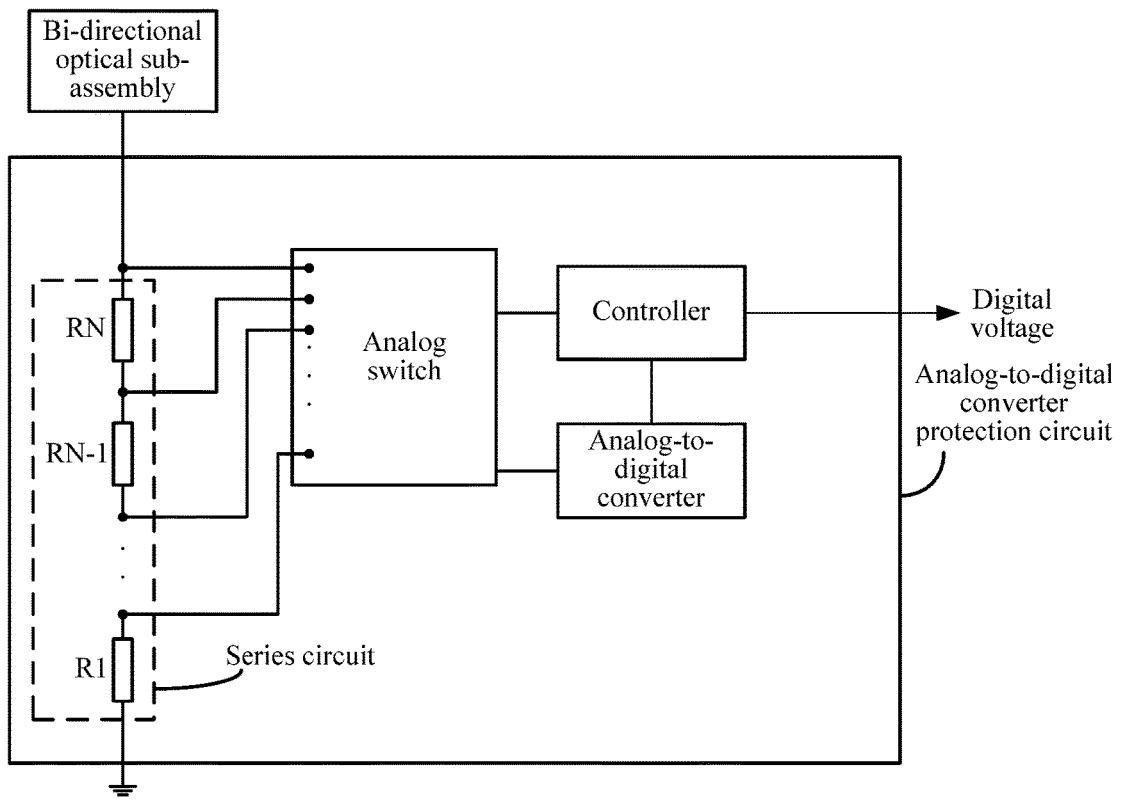
FIG. 2 is a schematic structural diagram of an analog-to-digital converter protection circuit according to an embodiment of the present invention.

Referring to FIG. 2, FIG. 2 is a schematic structural diagram of an analog-to-digital converter protection circuit according to an embodiment of the present invention. As shown in FIG. 2, the analog-to-digital converter protection circuit includes an analog switch, an analog-to-digital converter, a controller, and a series circuit. The series circuit includes at least two resistors connected in series, for example, R1 to RN shown in FIG. 2, where N is an integer greater than or equal to 2.

A head end of the series circuit is configured to be connected to an output end of a bi-directional optical sub-assembly BOSA. A tail end of the series circuit is configured to be grounded. A ground-distant end of each resistor in the series circuit is connected to a different sampling end of the analog switch. An output end of the analog switch is connected to an input end of the analog-to-digital converter. An output end of the analog-to-digital converter is connected to an input end of the controller. A first output end of the controller is connected to a control end of the analog switch.

The series circuit is configured to convert a photocurrent outputted by the BOSA into an analog voltage. The different sampling end is configured to sample the analog voltage outputted by the series circuit. The analog switch is configured to output, to the analog-to-digital converter, an analog voltage sampled by a conduction sampling end of the analog switch, and a first sampling end serves as the conduction sampling end to conduct to the output end of the analog switch.

The analog-to-digital converter is configured to: perform analog-to-digital conversion on the analog voltage sampled by the conduction sampling end to generate a digital voltage, and output the digital voltage to the controller.

The controller is configured to: when the digital voltage is greater than or equal to a first preset voltage threshold, output a first control signal to the analog switch, where the first control signal is used to trigger the analog switch to control a second sampling end to serve as the conduction sampling end to conduct to the output end of the analog switch, and an analog voltage sampled by the second sampling end is less than an analog voltage sampled by the first sampling end; and when the digital voltage is less than the first preset voltage threshold, control a second output end of the controller to output the digital voltage, where the first preset voltage threshold falls within a sampling voltage range of the analog-to-digital converter.

In this embodiment of the present invention, the analog switch is controlled, according to a relationship between the digital voltage obtained by the controller and the first preset voltage threshold stored in the controller, to switch the conduction sampling end conducted to the output end of analog switch, so that the analog-to-digital converter can sample an analog voltage within a sampling voltage range of the analog-to-digital converter. Therefore, a problem of damage to the analog-to-digital converter due to that the analog voltage exceeds the sampling voltage range of the analog-to-digital converter is avoided.

In an optional implementation manner, that when the digital voltage is less than the first preset voltage threshold, the controller controls a second output end of the controller to output the digital voltage is specifically: when the digital voltage is less than the first preset voltage threshold and the digital voltage is greater than a second preset voltage threshold, controlling the second output end of the controller to output the digital voltage, where the second preset voltage threshold falls within the sampling voltage range.

The controller is further configured to: when the digital voltage is less than or equal to the second preset voltage threshold, output a second control signal to the analog switch, where the second control signal is used to trigger the analog switch to control a third sampling end to serve as the conduction sampling end to conduct to the output end of the analog switch, and an analog voltage sampled by the third sampling end is greater than the analog voltage sampled by the first sampling end.

As can be seen, when the digital voltage is less than the first preset voltage threshold and is greater than the second preset voltage threshold, the second output end of the controller is controlled to output the digital voltage. When the digital voltage received by the controller is less than or equal to the second preset voltage threshold, the controller outputs a control signal to the analog switch, to trigger the analog switch to control and change the conduction sampling end conducted to the output end of the analog switch. The digital voltage outputted by the analog-to-digital converter (that is the digital voltage received by the controller) is increased by changing the conduction sampling end conducted to the output end of the analog switch. This not only ensures that the analog-to-digital converter can sample an analog voltage within a sampling voltage range of the analog-to-digital converter, but also ensures sampling precision of the analog-to-digital converter, so that the digital voltage outputted by the controller falls within an effective scale.

It should be noted that the first preset voltage threshold and the second preset voltage threshold are preset voltage thresholds, which may be calculated by the controller according to a preset calculation rule and the sampling voltage range of the analog-to-digital converter, or may be set by a user according to the user's requirements and the sampling voltage range of the analog-to-digital converter. This is not limited in this embodiment of the present invention.

In an optional implementation manner, when the analog switch controls and changes the conduction sampling end conducted to the output end of the analog switch, a resistor quantity change between the conduction sampling end conducted to the output end of the analog switch and the tail end of the series circuit is at least 1. That is, when the conduction sampling end conducted to the output end of the analog switch changes from the first sampling end to the second sampling end, a difference between a resistor quantity between the first sampling end and the tail end of the series circuit and a resistor quantity between the second sampling end and the tail end of the series circuit is an integer greater than or equal to 1; when the conduction sampling end conducted to the output end of the analog switch changes from the first sampling end to the third sampling end, a difference between a resistor quantity between the third sampling end and the tail end of the series circuit and the resistor quantity between the first sampling end and the tail end of the series circuit is an integer greater than or equal to 1. This provides a basis for generating the control signal to the controller.

In this embodiment of the present invention, an initial conduction sampling end conducted to the output end of the analog switch is a sampling end connected to a ground-distant end of a tail resistor of the series circuit. That is, after the analog-to-digital converter protection circuit shown in FIG. 2 finishes the sampling work or before the analog-to-digital converter protection circuit starts sampling, the controller outputs the control signal to the analog switch, to trigger the analog switch to switch the conduction sampling end conducted to the output end of the analog switch to the initial conduction sampling end. In this way, when the analog-to-digital converter protection circuit shown in FIG. 2 starts sampling, a problem of damage to the analog-to-digital converter due to that the analog voltage received by the analog-to-digital converter exceeds the sampling voltage range of the analog-to-digital converter can be avoided.

Optionally, a product of a total resistance value of all resistors in the series circuit and a preset photocurrent threshold is greater than or equal to sampling precision of the analog-to-digital converter, a product of a resistance value of the tail resistor of the series circuit and the preset photocurrent threshold falls within the sampling voltage range, and the preset photocurrent threshold is a minimum value of the photocurrent outputted by the BOSA. This not only ensures the sampling precision of the analog-to-digital converter, but also ensures that the analog-to-digital converter can sample an analog voltage within a sampling voltage range of the analog-to-digital converter.

In this embodiment of the present invention, the sampling precision of the analog-to-digital converter is equal to a ratio of a maximum sampling voltage (that is, a sampling voltage scale) of the analog-to-digital converter to 2 raised to the power of M, where M is a quantity of bits of the analog-to-digital converter. In this way, the analog-to-digital converter can output a precise digital voltage. For example, for a 10-bit analog-to-digital converter having a sampling voltage scale of 2 V, the sampling precision is equal to $2/2^{10}$ V.

In this embodiment of the present invention, when the digital voltage is greater than the second preset voltage threshold and is less than the first preset voltage threshold, the controller does not output any control signal to the analog switch. That is, the analog switch maintains the conduction between the conduction sampling end and the output end of the analog signal. In this case, the controller controls the second output end of the controller to output the digital voltage that is greater than the second preset voltage threshold and less than the first preset voltage threshold.

Optionally, the controller may be a bi-directional optical sub-assembly drive chip.

In this embodiment of the present invention, the controller may be a bi-directional optical sub-assembly drive chip in a current ONU. In this way, hardware costs of the analog-to-digital converter protection circuit can be reduced.

Optionally, the analog switch may include, but is not limited to, any one of an integrated analog switch component, a discrete component, or a relay.

Figure 3:
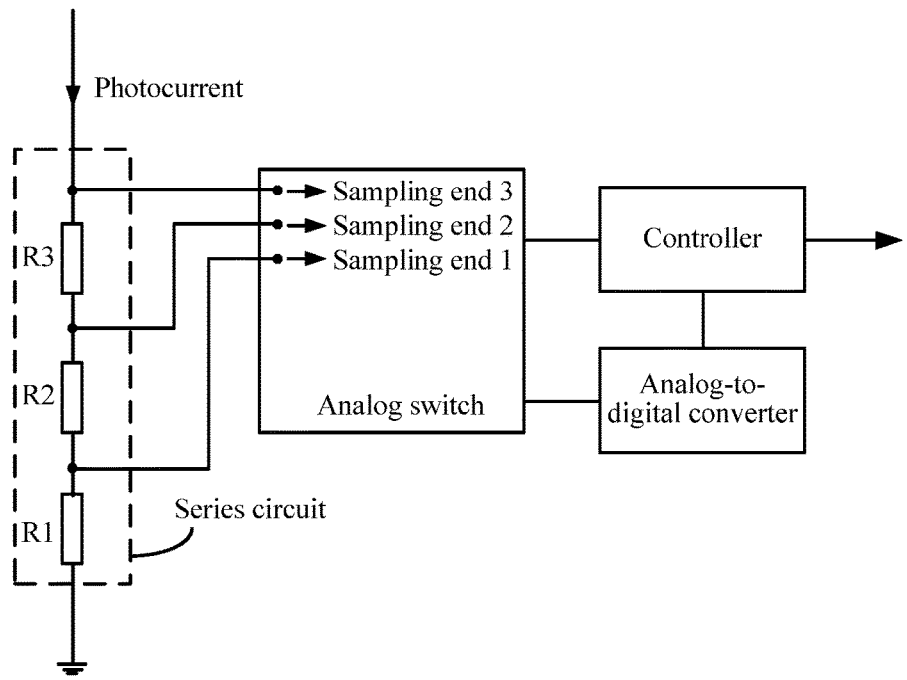
FIG. 3 is a schematic structural diagram showing that a controller controls an analog switch according to an embodiment of the present invention.

As shown in FIG. 3, how the controller selects the conduction sampling end is described by using an example. Assuming that there are three resistors in the foregoing series circuit, a schematic structural diagram showing that the controller controls the analog switch may be shown in FIG. 3. FIG. 3 is a schematic structural diagram showing that the controller controls the analog switch according to an embodiment of the present invention. In FIG. 3, the three resistors in the series circuit are respectively R1, R2, and R3. The analog switch has three sampling ends. The three sampling ends are respectively sampling end 1, sampling end 2, and sampling end 3. A ground-distant end of R1 is connected to sampling end 1, a ground-distant end of R2 is connected to sampling end 2, and a ground-distant end of R3 is connected to sampling end 3. In FIG. 3, sampling end 1 serves as an initial conduction sampling end to conduct to the output end of the analog switch. A sampling voltage range of the analog-to-digital converter is 0 V to 2 V (that is, a sampling voltage scale of the analog-to-digital converter is 2 V). The first preset voltage threshold is ¾ of the sampling voltage scale of the analog-to-digital converter, that is, 1.50 V. The second preset voltage threshold is ¼ of the sampling voltage scale of the analog-to-digital converter, that is, 0.50 V. The photocurrent has a value range of 0.05 mA to 1 mA. The preset photocurrent threshold is a minimum value of the photocurrent, that is, 0.05 mA. Resistance values of R1, R2, and R3 are respectively 1 K, 1.8 K, and 5 K. $(1+1.8+5)*0.05$ is greater than $2/2^{10}$, and $1*0.05$ falls within the sampling voltage range of 0 V to 2 V of the analog-to-digital converter.

When the photocurrent received by the series circuit is greater than or equal to 50 μA and is less than or equal to 178 μA, an analog voltage sampled by sampling end 1 is greater than or equal to 0.05 V and is less than or equal to 0.18 V. After performing analog-to-digital conversion on the analog voltage, the analog-to-digital converter outputs, to the controller, a digital voltage that is greater than or equal to 0.05 V and less than or equal to 0.18 V. Because 0.18 V is less than the second preset voltage threshold of 0.5 V, the controller outputs a control signal to the analog switch, to trigger the analog switch to control sampling end 2 to serve as the conduction sampling end to conduct to the output end of the analog switch, and sampling end 1 is not conducted to the output end of the analog switch. In this case, for a photocurrent greater than or equal to 50 μA and less than or equal to 178 μA, the analog-to-digital converter outputs, to the controller, a digital voltage greater than or equal to 0.14 V and less than or equal to 0.50 V. Because 0.50 V is equal to the second preset voltage threshold of 0.5 V, the controller outputs a control signal to the analog switch, to trigger the analog switch to control sampling end 3 to serve as the conduction sampling end to conduct to the output end of the analog switch, and sampling end 2 is not conducted to the output end of the analog switch.

Similarly, when the photocurrent received by the series circuit is greater than 178 μA and is less than or equal to 192 μA, the controller does not output any control signal to the analog switch, that is, the analog switch maintains the conduction between sampling end 3 and the output end of the analog switch. When the photocurrent received by the series circuit is greater than 192 μA and is less than or equal to 256 μA, because sampling end 3 is conducted to the output end of the analog switch and the analog voltage received by the controller is greater than 1.50 V, the controller outputs a control signal to the analog switch, to trigger the analog switch to control sampling end 2 to serve as the conduction sampling end to conduct to the output end of the analog switch. When the photocurrent received by the series circuit is greater than 256 μA and is less than or equal to 536 μA, the controller does not output any control signal to the analog switch, that is, the analog switch maintains the conduction between sampling end 2 and the output end of the analog switch. When the photocurrent received by the series circuit is greater than 536 μA and is less than or equal to 714 μA, the controller outputs a control signal to the analog switch, to trigger the analog switch to control sampling end 1 to serve as the conduction sampling end to conduct to the output end of the analog switch. When the photocurrent received by the series circuit is greater than 714 μA and is less than or equal to 1000 μA, the controller does not output any control signal to the analog switch, that is, the analog switch maintains the conduction between sampling end 1 and the output end of the analog switch.

Based on the above, in the schematic structural diagram showing that the controller controls the analog switch in FIG. 3, when the photocurrent received by the series circuit is greater than or equal to 50 μA and is less than or equal to 192 μA, sampling end 3 of the analog switch serves as the conduction sampling end to conduct to the output end of the analog switch. When the photocurrent received by the series circuit is greater than 192 μA and is less than or equal to 536 μA, sampling end 2 of the analog switch serves as the conduction sampling end to conduct to the output end of the analog switch. When the photocurrent received by the series circuit is greater than 536 μA and is less than or equal to 1000 μA, sampling end 1 of the analog switch serves as the conduction sampling end to conduct to the output end of the analog switch. This ensures that the analog-to-digital converter can sample an analog voltage within a sampling voltage range of 0 V to 2 V of the analog-to-digital converter when the received photocurrent falls within a range of 0.05 mA to 1 mA, ensures sampling precision of the analog-to-digital converter, and avoids a problem of damage to the analog-to-digital converter due to that the analog voltage exceeds the sampling voltage range of the analog-to-digital converter.

Figure 4:
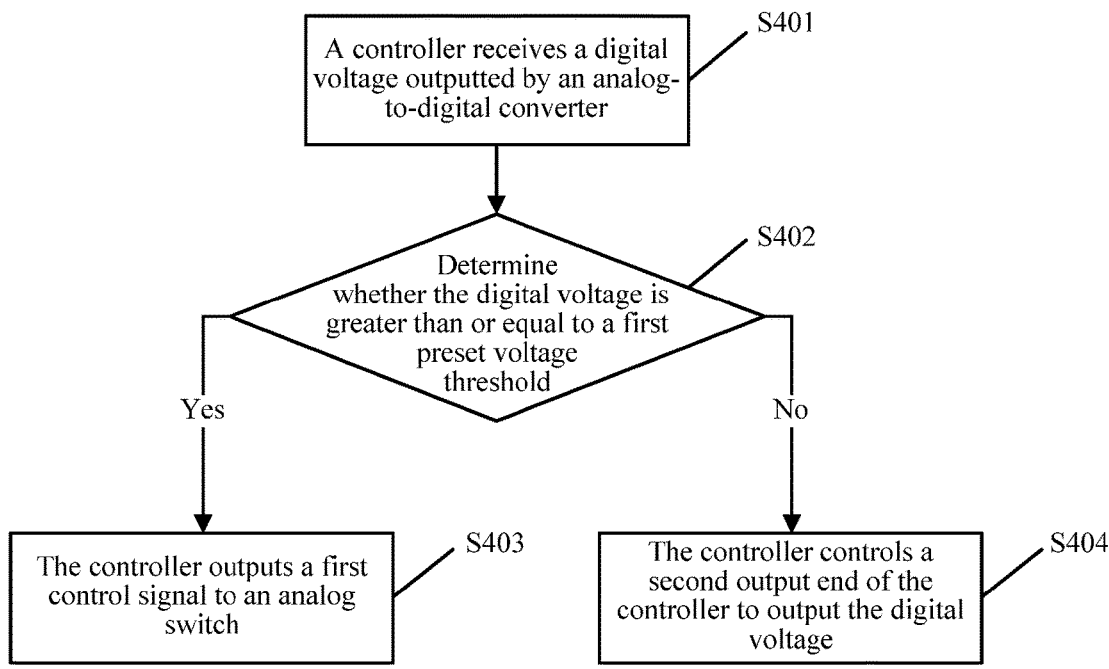
FIG. 4 is a schematic flowchart of a method for controlling an analog-to-digital converter protection circuit according to an embodiment of the present invention.

Referring to FIG. 4, FIG. 4 is a schematic flowchart of a method for controlling an analog-to-digital converter protection circuit according to an embodiment of the present invention. The method shown in FIG. 4 is applicable to the analog-to-digital converter protection circuit shown in FIG. 2, and is executed by the controller in the analog-to-digital converter protection circuit shown in FIG. 2. As shown in FIG. 4, the method for controlling an analog-to-digital converter protection circuit may include the following steps.

S401: A controller receives a digital voltage outputted by an analog-to-digital converter.

In this embodiment of the present invention, the digital voltage outputted by the analog-to-digital converter is a digital voltage obtained by the analog-to-digital converter by performing analog-to-digital conversion on an analog voltage sampled by a conduction sampling end of an analog switch, and a first sampling end serves as the conduction sampling end to conduct to an output end of the analog switch.

S402: Determine whether the digital voltage is greater than or equal to a first preset voltage threshold.

In this embodiment of the present invention, when a result of the determining in step S402 is yes, the controller performs step S403; when the result of determining in step S402 is no, the controller performs step S404.

S403: The controller outputs a first control signal to an analog switch.

In this embodiment of the present invention, the first preset voltage threshold falls within a sampling voltage range of the analog-to-digital converter. The controller outputs the first control signal to the analog switch, to trigger the analog switch to switch the conduction sampling end conducted to the output end of the analog switch from the first sampling end to a second sampling end. An analog voltage sampled by the second sampling end is less than an analog voltage sampled by the first sampling end. A quantity of conduction sampling ends conducted to the output end of the analog switch is one, that is, only one sampling end in all sampling ends of the analog switch is conducted to the output end of the analog switch.

S404: The controller controls a second output end of the controller to output the digital voltage.

In this embodiment of the present invention, when the digital voltage is less than the first preset voltage threshold, the controller controls the second output end of the controller to output the digital voltage.

In this embodiment of the present invention, the analog switch is controlled, according to a relationship between the digital voltage obtained by the controller and the first preset voltage threshold stored in the controller, to switch the conduction sampling end conducted to the output end of analog switch, so that the analog-to-digital converter can sample an analog voltage within a sampling voltage range of the analog-to-digital converter. Therefore, a problem of damage to the analog-to-digital converter due to that the analog voltage exceeds the sampling voltage range of the analog-to-digital converter is avoided.

In an optional implementation manner, when the digital voltage is less than the first preset voltage threshold, before step S404, the method for controlling an analog-to-digital converter protection circuit may further include the following step: determining, by the controller, whether the digital voltage is greater than a second preset voltage threshold.

That the controller controls a second output end of the controller to output the digital voltage may be specifically: when the digital voltage is less than the first preset voltage threshold and the digital voltage is greater than the second preset voltage threshold, controlling, by the controller, the second output end of the controller to output the digital voltage, where the second preset voltage threshold falls within the sampling voltage range.

In this embodiment of the present invention, the method for controlling an analog-to-digital converter protection circuit may further include the following step: when the digital voltage is less than or equal to the second preset voltage threshold, outputting, by the controller, a second control signal to the analog switch, where the second control signal is used to trigger the analog switch to switch the conduction sampling end conducted to the output end of the analog switch from the first sampling end to a third sampling end, and an analog voltage sampled by the third sampling end is greater than the analog voltage sampled by the first sampling end.

As can be seen, when the digital voltage is less than the first preset voltage threshold and is greater than the second preset voltage threshold, the second output end of the controller is controlled to output the digital voltage. When the digital voltage received by the controller is less than or equal to the second preset voltage threshold, the controller outputs a control signal to the analog switch, to trigger the analog switch to control and change the conduction sampling end conducted to the output end of the analog switch. The digital voltage outputted by the analog-to-digital converter (that is the digital voltage received by the controller) is increased by changing the conduction sampling end conducted to the output end of the analog switch. This not only ensures that the analog-to-digital converter can sample an analog voltage within a sampling voltage range of the analog-to-digital converter, but also ensures sampling precision of the analog-to-digital converter, so that the digital voltage outputted by the controller falls within an effective scale.

It should be noted that the first preset voltage threshold and the second preset voltage threshold are preset voltage thresholds, which may be calculated by the controller according to a preset calculation rule and the sampling voltage range of the analog-to-digital converter, or may be set by a user according to the user's requirements and the sampling voltage range of the analog-to-digital converter. This is not limited in this embodiment of the present invention.

In an optional implementation manner, when the analog switch controls and changes the conduction sampling end conducted to the output end of the analog switch, a resistor quantity change between the conduction sampling end conducted to the output end of the analog switch and a tail end of a series circuit is at least 1. That is, when the conduction sampling end conducted to the output end of the analog switch changes from the first sampling end to the second sampling end, a difference between a resistor quantity between the first sampling end and the tail end of the series circuit and a resistor quantity between the second sampling end and the tail end of the series circuit is an integer greater than or equal to 1; when the conduction sampling end conducted to the output end of the analog switch changes from the first sampling end into the third sampling end, a difference between a resistor quantity between the third sampling end and the tail end of the series circuit and the resistor quantity between the first sampling end and the tail end of the series circuit is an integer greater than or equal to 1. This provides a basis for generating the control signal to the controller.

In this embodiment of the present invention, an initial conduction sampling end conducted to the output end of the analog switch is a sampling end connected to a ground-distant end of a tail resistor of the series circuit. That is, after the analog-to-digital converter protection circuit shown in FIG. 2 finishes the sampling work or after a preset working period, the controller outputs a control signal to the analog switch, to trigger the analog switch to switch the conduction sampling end conducted to the output end of the analog switch to the initial conduction sampling end. In this way, when the analog-to-digital converter protection circuit shown in FIG. 2 starts working, a problem of damage to the analog-to-digital converter due to that the analog voltage received by the analog-to-digital converter exceeds the sampling voltage range of the analog-to-digital converter can be avoided.

Optionally, a product of a total resistance value of all resistors in the series circuit and a preset photocurrent threshold is greater than or equal to sampling precision of the analog-to-digital converter, a product of a resistance value of the tail resistor of the series circuit and the preset photocurrent threshold falls within the sampling voltage range, and the preset photocurrent threshold is a minimum value of a photocurrent outputted by a BOSA. This not only ensures the sampling precision of the analog-to-digital converter, but also ensures that the analog-to-digital converter can sample an analog voltage within a sampling voltage range of the analog-to-digital converter.

Optionally, the controller may be a bi-directional optical sub-assembly drive chip.

In this embodiment of the present invention, the controller may be a bi-directional optical sub-assembly drive chip in a current ONU. In this way, hardware costs of the analog-to-digital converter protection circuit can be reduced.

Optionally, the analog switch may include, but is not limited to, any one of an integrated analog switch component, a discrete component, or a relay.

Figure 5:
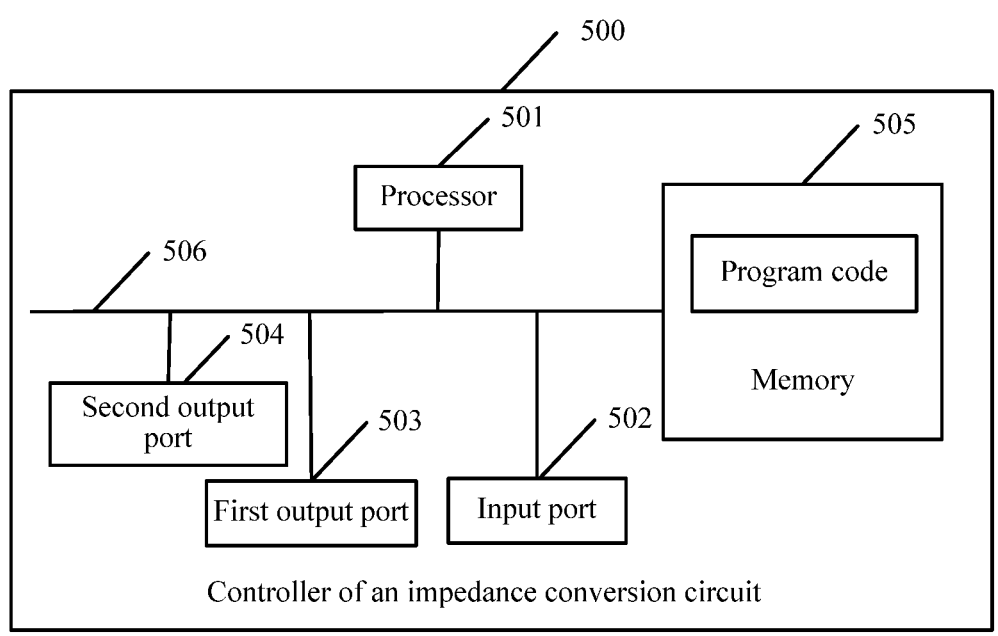
FIG. 5 is a schematic structural diagram of a controller of an analog-to-digital converter protection circuit according to an embodiment of the present invention.

Referring to FIG. 5, FIG. 5 is a schematic structural diagram of a controller of an analog-to-digital converter protection circuit according to an embodiment of the present invention. The controller 500 shown in FIG. 5 is the controller in the analog-to-digital converter protection circuit in FIG. 2. As shown in FIG. 5, the controller 500 of the analog-to-digital converter protection circuit may include: at least one processor 501 such as a CPU, an input port 502, a first output port 503, a second output port 504, a memory 505, and at least one communications bus 506. The memory 505 may be a high-speed RAM memory, or may be a non-volatile memory (non-volatile memory), for example, at least one magnetic disk storage. Optionally, the memory 505 may be at least one storage apparatus far away from the processor 501.

The communications bus 506 is configured to implement connection and communication between the components.

The input port 502 is configured to receive a digital voltage outputted by an analog-to-digital converter.

In this embodiment of the present invention, the digital voltage outputted by the analog-to-digital converter is a digital voltage obtained by the analog-to-digital converter by performing analog-to-digital conversion on an analog voltage sampled by a conduction sampling end of an analog switch, and a first sampling end serves as the conduction sampling end to conduct to an output end of the analog switch.

The memory 505 stores a set of program code, and the processor 501 is configured to invoke the program code stored in the memory 505 to perform the following operations: determining whether the digital voltage is greater than or equal to a first preset voltage threshold, where the first preset voltage threshold falls within a sampling voltage range of the analog-to-digital converter; and when the digital voltage is greater than or equal to the first preset voltage threshold, generating a first control signal.

The first output port 503 is configured to output the first control signal to the analog switch. The first control signal is used to trigger the analog switch to switch the conduction sampling end conducted to the output end of the analog switch from the first sampling end to a second sampling end. An analog voltage sampled by the second sampling end is less than an analog voltage sampled by the first sampling end. A quantity of conduction sampling ends conducted to the output end of the analog switch is 1, that is, only one sampling end in all sampling ends of the analog switch is conducted to the output end of the analog switch.

The second output port 504 is configured to: when the processor 501 determines that the digital voltage is less than the first preset voltage threshold, output the digital voltage.

In this embodiment of the present invention, the controller 500 controls, according to a relationship between the digital voltage received by the input port 502 and the first preset voltage threshold stored in the controller, the analog switch to switch the conduction sampling end conducted to the output end of analog switch, so that the analog-to-digital converter can sample an analog voltage within a sampling voltage range of the analog-to-digital converter. Therefore, a problem of damage to the analog-to-digital converter due to that the analog voltage exceeds the sampling voltage range of the analog-to-digital converter is avoided.

In an embodiment, the processor 501 is configured to invoke the program code stored in the memory 505 to further perform the following operations: determining whether the digital voltage is greater than a second preset voltage threshold, where the second preset voltage threshold is less than the first preset voltage threshold and falls within the sampling voltage range; and when the digital voltage is not greater than (that is, less than or equal to) the second preset voltage threshold, generating a second control signal.

The second output port 504 is specifically configured to: when the digital voltage is less than the first preset voltage threshold and the digital voltage is greater than the second preset voltage threshold, output the digital voltage.

The first output port 503 may be further configured to output the second control signal to the analog switch. The second control signal is used to trigger the analog switch to switch the conduction sampling end conducted to the output end of the analog switch from the first sampling end to a third sampling end, and an analog voltage sampled by the third sampling end is greater than the analog voltage sampled by the first sampling end.

As can be seen, when the digital voltage received by the input port 502 is less than the first preset voltage threshold and is greater than the second preset voltage threshold, the second output port 504 outputs the digital voltage. When the digital voltage received by the input port 502 is less than or equal to the second preset voltage threshold, the first output port 503 outputs a control signal to the analog switch, to trigger the analog switch to control and change the conduction sampling end conducted to the output end of the analog switch. The digital voltage outputted by the analog-to-digital converter (that is, the digital voltage received by the input port 502) is increased by changing the conduction sampling end conducted to the output end of the analog switch. This not only ensures that the analog-to-digital converter can sample an analog voltage within a sampling voltage range of the analog-to-digital converter, but also ensures sampling precision of the analog-to-digital converter, so that the digital voltage outputted by the second output port 504 falls within an effective scale.

It should be noted that the first preset voltage threshold and the second preset voltage threshold are preset voltage thresholds, which may be calculated by the controller according to a preset calculation rule and the sampling voltage range of the analog-to-digital converter, or may be set by a user according to the user's requirements and the sampling voltage range of the analog-to-digital converter. This is not limited in this embodiment of the present invention.

In an optional implementation manner, when the analog switch controls and changes the conduction sampling end conducted to the output end of the analog switch, a resistor quantity change between the conduction sampling end conducted to the output end of the analog switch and a tail end of a series circuit is at least 1. This provides a basis for generating the control signal to the processor 501.

In an embodiment, an initial conduction sampling end conducted to the output end of the analog switch is a sampling end connected to a ground-distant end of a tail resistor of the series circuit, and a product of a resistance value of the tail resistor of the series circuit and a preset photocurrent threshold falls within the sampling voltage range. This ensures that the analog-to-digital converter can sample an analog voltage within a sampling voltage range of the analog-to-digital converter.

In an embodiment, a product of a total resistance value of all resistors in the series circuit and the preset photocurrent threshold is greater than or equal to sampling precision of the analog-to-digital converter, and the preset photocurrent threshold is a minimum value of a photocurrent outputted by a BOSA. This ensures the sampling precision of the analog-to-digital converter.

Optionally, the controller 500 may be a bi-directional optical sub-assembly drive chip.

In this embodiment of the present invention, the controller 500 may be a bi-directional optical sub-assembly drive chip in a current ONU. In this way, hardware costs of the analog-to-digital converter protection circuit may be reduced.

Optionally, the analog switch may include, but is not limited to, any one of an integrated analog switch component, a discrete component, or a relay.

It should be noted that the first sampling end, the second sampling end, the third sampling end that are involved in the foregoing embodiments do not represent the first sampling end, the second sampling end, and the third sampling end that are obtained after all the sampling ends of the analog switch are arranged in order, but represent three different sampling ends.

It should be noted that, in the foregoing embodiments, the descriptions of the embodiments have respective focuses. For a part that is not described in detail in an embodiment, reference may be made to related descriptions in other embodiments. In addition, a person skilled in the art should also appreciate that all the embodiments described in the specification are exemplary embodiments, and the related actions are not necessarily mandatory to the present invention.

The steps in the method of the embodiments of the present invention may be reordered, combined, or omitted according to actual requirements.

A person of ordinary skill in the art may understand that all or a part of the processes of the methods in the embodiments may be implemented by a computer program instructing relevant hardware. The program may be stored in a computer readable storage medium. When the program runs, the processes of the methods in the embodiments are performed. The foregoing storage medium may include: a magnetic disk, an optical disc, a read-only memory (ROM), or a random access memory (RAM).

The analog-to-digital converter protection circuit, the method for controlling an analog-to-digital converter protection circuit, and the controller that are disclosed in the embodiments of the present invention are described above in detail. In this specification, specific examples are used to describe the principle and implementation manners of the present invention, and the descriptions of the embodiments are only intended to help understand the present invention and the core idea of the present invention. Meanwhile, a person of ordinary skill in the art may, based on the idea of the present invention, make modifications with respect to the specific implementation manners and the application scope. Therefore, the content of this specification shall not be construed as a limitation to the present invention.

What is claimed is:

1. An analog-to-digital converter protection circuit, comprising:
    an analog switch;
    an analog-to-digital converter;
    a controller; and
    a series circuit;
    wherein the series circuit comprises a plurality of resistors connected in series;
    wherein a head end of the series circuit is configured to be connected to an output end of a bi-directional optical sub-assembly (BOSA), a tail end of the series circuit is configured to be grounded, a ground-distant end of each resistor in the series circuit is connected to a different sampling end of the analog switch, an output end of the analog switch is connected to an input end of the analog-to-digital converter, an output end of the analog-to-digital converter is connected to an input end of the controller, and a first output end of the controller is connected to a control end of the analog switch;
    wherein the series circuit is configured to convert a photocurrent outputted by the BOSA into an analog voltage, the different sampling end is configured to sample the analog voltage outputted by the series circuit, the analog switch is configured to output, to the analog-to-digital converter, an analog voltage sampled by a conduction sampling end of the analog switch, and a first sampling end serves as the conduction sampling end to conduct to the output end of the analog switch;
    wherein the analog-to-digital converter is configured to perform analog-to-digital conversion on the analog voltage sampled by the conduction sampling end to generate a digital voltage, and output the digital voltage to the controller; and
    wherein the controller is configured to:
        when the digital voltage is greater than or equal to a first preset voltage threshold, output a first control signal to the analog switch, wherein the first control signal triggers the analog switch to control a second sampling end to serve as the conduction sampling end to conduct to the output end of the analog switch, and an analog voltage sampled by the second sampling end is less than an analog voltage sampled by the first sampling end; and
        when the digital voltage is less than the first preset voltage threshold, control a second output end of the controller to output the digital voltage, wherein the first preset voltage threshold falls within a sampling voltage range of the analog-to-digital converter.

2. The analog-to-digital converter protection circuit according to claim 1, wherein when the digital voltage is less than the first preset voltage threshold, the controller controlling a second output end of the controller to output the digital voltage comprises:
    when the digital voltage is less than the first preset voltage threshold and the digital voltage is greater than a second preset voltage threshold, controlling the second output end of the controller to output the digital voltage, wherein the second preset voltage threshold falls within the sampling voltage range; and
    wherein the controller is further configured to, when the digital voltage is less than or equal to the second preset voltage threshold, output a second control signal to the analog switch, wherein the second control signal is used to trigger the analog switch to control a third sampling end to serve as the conduction sampling end to conduct to the output end of the analog switch, and an analog voltage sampled by the third sampling end is greater than the analog voltage sampled by the first sampling end.

3. The analog-to-digital converter protection circuit according to claim 1, wherein when the analog switch changes the conduction sampling end conducted to the output end of the analog switch, a resistor quantity change between the conduction sampling end conducted to the output end of the analog switch and the tail end of the series circuit is at least 1.

4. The analog-to-digital converter protection circuit according to claim 1, wherein an initial conduction sampling end conducted to the output end of the analog switch is a sampling end connected to a ground-distant end of a tail resistor of the series circuit; and
    wherein a product of a resistance value of the tail resistor of the series circuit and a preset photocurrent threshold falls within the sampling voltage range.

5. The analog-to-digital converter protection circuit according to claim 1, wherein a product of a total resistance value of all resistors in the series circuit and a preset photocurrent threshold is greater than or equal to sampling precision of the analog-to-digital converter.

6. The analog-to-digital converter protection circuit according to claim 1, wherein the controller is a bi-directional optical sub-assembly drive chip.

7. The analog-to-digital converter protection circuit according to claim 1 wherein the analog switch comprises an integrated analog switch component, a discrete component, or a relay.

8. A method, comprising:
receiving, by a controller, a digital voltage outputted by an analog-to-digital converter, wherein an analog-to-digital converter protection circuit comprises an analog switch, the analog-to-digital converter, the controller, and a series circuit, the series circuit comprises a plurality of resistors connected in series, a head end of the series circuit is configured to be connected to an output end of a bi-directional optical sub-assembly (BOSA), a tail end of the series circuit is configured to be grounded, a ground-distant end of each resistor in the series circuit is connected to a different sampling end of the analog switch, an output end of the analog switch is connected to an input end of the analog-to-digital converter, an output end of the analog-to-digital converter is connected to an input end of the controller, a first output end of the controller is connected to a control end of the analog switch, and wherein the digital voltage is a digital voltage obtained by the analog-to-digital converter by performing analog-to-digital conversion on an analog voltage sampled by a conduction sampling end of the analog switch, and a first sampling end serves as the conduction sampling end to conduct to the output end of the analog switch;
when the digital voltage is greater than or equal to a first preset voltage threshold, outputting, by the controller, a first control signal to the analog switch, wherein the first control signal triggers the analog switch to control a second sampling end to serve as the conduction sampling end to conduct to the output end of the analog switch, an analog voltage sampled by the second sampling end is less than an analog voltage sampled by the first sampling end, and the first preset voltage threshold falls within a sampling voltage range of the analog-to-digital converter; and
when the digital voltage is less than the first preset voltage threshold, controlling, by the controller, a second output end of the controller to output the digital voltage.

9. The method according to claim 8, wherein when the digital voltage is less than the first preset voltage threshold, controlling the second output end of the controller to output the digital voltage comprises:
when the digital voltage is less than the first preset voltage threshold and the digital voltage is greater than a second preset voltage threshold, controlling, by the controller, the second output end of the controller to output the digital voltage, wherein the second preset voltage threshold falls within the sampling voltage range; and
wherein the method further comprises:
when the digital voltage is less than or equal to the second preset voltage threshold, outputting, by the controller, a second control signal to the analog switch, wherein the second control signal triggers the analog switch to control a third sampling end to serve as the conduction sampling end to conduct to the output end of the analog switch, and an analog voltage sampled by the third sampling end is greater than the analog voltage sampled by the first sampling end.

10. The method according to claim 8, wherein when the analog switch controls and changes the conduction sampling end conducted to the output end of the analog switch, a resistor quantity change between the conduction sampling end conducted to the output end of the analog switch and the tail end of the series circuit is at least 1.

11. The method according to claim 8, wherein an initial conduction sampling end conducted to the output end of the analog switch is a sampling end connected to a ground-distant end of a tail resistor of the series circuit; and
wherein a product of a resistance value of the tail resistor of the series circuit and a preset photocurrent threshold falls within the sampling voltage range.

12. The method according to claim 8, wherein a product of a total resistance value of all resistors in the series circuit and a preset photocurrent threshold is greater than or equal to sampling precision of the analog-to-digital converter.

13. The method according to claim 8, wherein the controller is a bi-directional optical sub-assembly drive chip.

14. The method according to claim 8, wherein the analog switch comprises an integrated analog switch component, a discrete component, or a relay.

15. A controller of an analog-to-digital converter protection circuit, comprising:
a processor;
a memory;
an input port;
a first output port; and
a second output port;
wherein the analog-to-digital converter protection circuit comprises an analog switch, an analog-to-digital converter, the controller, and a series circuit, the series circuit comprises at least two resistors connected in series, a head end of the series circuit is configured to be connected to an output end of a bi-directional optical sub-assembly (BOSA), a tail end of the series circuit is configured to be grounded, a ground-distant end of each resistor in the series circuit is connected to a different sampling end of the analog switch, an output end of the analog switch is connected to an input end of the analog-to-digital converter, an output end of the analog-to-digital converter is connected to the input port, and the first output port is connected to a control end of the analog switch;
wherein the input port is configured to receive a digital voltage outputted by the analog-to-digital converter, wherein the digital voltage is a digital voltage obtained by the analog-to-digital converter by performing analog-to-digital conversion on an analog voltage sampled by a conduction sampling end of the analog switch, and a first sampling end serves as the conduction sampling end to conduct to the output end of the analog switch;
wherein the memory stores a set of program code, and the processor is configured to invoke the program code stored in the memory to determine whether the digital voltage is greater than or equal to a first preset voltage threshold, wherein the first preset voltage threshold falls within a sampling voltage range of the analog-to-digital converter;
wherein the first output port is configured to, when the digital voltage is greater than or equal to the first preset voltage threshold, output a first control signal to the analog switch, wherein the first control signal is used to trigger the analog switch to control a second sampling end to serve as the conduction sampling end to conduct to the output end of the analog switch, and an analog voltage sampled by the second sampling end is less than an analog voltage sampled by the first sampling end; and wherein the second output port is configured to, when the digital voltage is less than the first preset voltage threshold, output the digital voltage.

16. The controller according to claim 15, wherein the processor is further configured to invoke the program code stored in the memory to determine whether the digital voltage is greater than a second preset voltage threshold, wherein the second preset voltage threshold falls within the sampling voltage range;

wherein the second output port is configured to, when the digital voltage is less than the first preset voltage threshold and the digital voltage is greater than the second preset voltage threshold, output the digital voltage; and wherein the first output port is further configured to, when the digital voltage is less than or equal to the second preset voltage threshold, output a second control signal to the analog switch, wherein the second control signal triggers the analog switch to control a third sampling end to serve as the conduction sampling end to conduct to the output end of the analog switch, and an analog voltage sampled by the third sampling end is greater than the analog voltage sampled by the first sampling end.

17. The controller according to claim 15, wherein when the analog switch controls and changes the conduction sampling end conducted to the output end of the analog switch, a resistor quantity change between the conduction sampling end conducted to the output end of the analog switch and the tail end of the series circuit is at least 1.

18. The controller according to claim 15, wherein an initial conduction sampling end conducted to the output end of the analog switch is a sampling end connected to a ground-distant end of a tail resistor of the series circuit; and wherein a product of a resistance value of the tail resistor of the series circuit and a preset photocurrent threshold falls within the sampling voltage range.

19. The controller according to claim 15, wherein a product of a total resistance value of all resistors in the series circuit and a preset photocurrent threshold is greater than or equal to sampling precision of the analog-to-digital converter.

20. The controller according to claim 15, wherein the controller is a bi-directional optical sub-assembly drive chip.

* * * * *